US012562209B2

(12) United States Patent
Kim et al.

(10) Patent No.: US 12,562,209 B2
(45) Date of Patent: Feb. 24, 2026

(54) MEMORY DEVICE AND REFRESH CONTROLLING METHOD THEREOF

(71) Applicant: Samsung Electronics Co., Ltd., Suwon-si (KR)

(72) Inventors: Dongha Kim, Suwon-si (KR); Do-Han Kim, Suwon-si (KR); Bobae Kim, Suwon-si (KR); Changmin Lee, Suwon-si (KR); Kyeongjin Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 175 days.

(21) Appl. No.: 18/522,252

(22) Filed: Nov. 29, 2023

(65) Prior Publication Data

US 2025/0006242 A1     Jan. 2, 2025

(30) Foreign Application Priority Data

Jun. 28, 2023     (KR) ........................ 10-2023-0083634

(51) Int. Cl.
*G11C 11/406*     (2006.01)
(52) U.S. Cl.
CPC .. *G11C 11/40618* (2013.01); *G11C 11/40615* (2013.01)

(58) Field of Classification Search
CPC ................................................ G11C 11/40618
See application file for complete search history.

(56) References Cited

U.S. PATENT DOCUMENTS

| | | | |
|---|---|---|---|
| 6,535,950 B1 | 3/2003 | Funyu et al. | |
| 8,705,307 B2 | 4/2014 | Henderson et al. | |
| 10,192,608 B2 | 1/2019 | Morgan | |
| 10,832,792 B1 * | 11/2020 | Penney | G11C 11/40607 |
| 11,417,384 B2 | 8/2022 | Du et al. | |
| 2022/0189537 A1 * | 6/2022 | Kim | G06F 3/0644 |
| 2023/0079457 A1 | 3/2023 | You | |

FOREIGN PATENT DOCUMENTS

EP     4138078 A1     2/2023

* cited by examiner

*Primary Examiner* — Hoai V Ho
(74) *Attorney, Agent, or Firm* — Muir Patent Law, PLLC

(57) ABSTRACT

A memory device according to an embodiment includes a memory cell array including a plurality of memory cells disposed in a plurality of rows, a register configured to store row addresses corresponding to the plurality of rows and access counts for the plurality of rows, and a refresh controller configured to determine a refresh address based on the stored row addresses and a refresh command being received, and change a refresh period for a target row based on the refresh address being associated with a previously performed refresh for the target row and the access count for a row corresponding to the target row being reached a threshold value.

19 Claims, 13 Drawing Sheets

Figure 2:
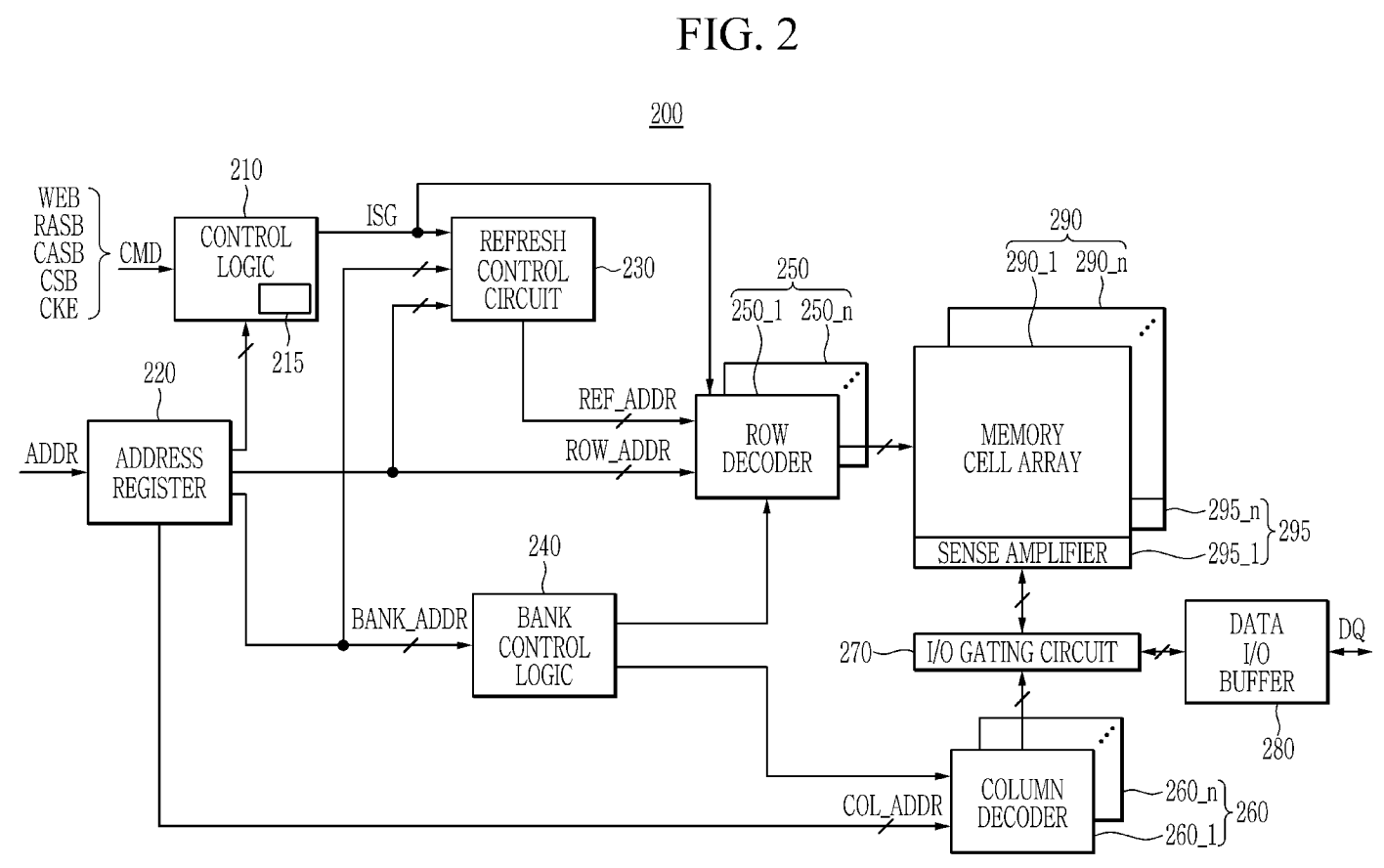

WEB
RASB
CASB
CSB
CKE
} CMD

210 CONTROL LOGIC

215

ISG

220 ADDRESS REGISTER

ADDR

230 REFRESH CONTROL CIRCUIT

REF_ADDR
ROW_ADDR

240 BANK CONTROL LOGIC

BANK_ADDR

250 { 250_1 250_n

ROW DECODER

290 { 290_1 290_n

295_n
295_1 } 295

MEMORY CELL ARRAY

SENSE AMPLIFIER

270 I/O GATING CIRCUIT

280 DATA I/O BUFFER

DQ

260 { 260_n 260_1

COLUMN DECODER

COL_ADDR

| ROW | ACCESS COUNT |
|------|------|
| 462 | 500 |
| 3 | 448 |
| 9 | 411 |
| 50 | 357 |
| 1032 | 271 |
| ... | ... |

| VROW | VICTIM POINT |
|------|--------------|
| 461 | 520 |
| 463 | 503 |
| 4 | 477 |
| 2 | 449 |
| 10 | 411 |
| ... | ... |

MEMORY DEVICE AND REFRESH CONTROLLING METHOD THEREOF

CROSS-REFERENCE TO RELATED APPLICATION

This application claims priority under 35 U.S.C. § 119 to Korean Patent Application No. 10-2023-0083634 filed on Jun. 28, 2023, in the Korean Intellectual Property Office, the disclosure of which is incorporated herein by reference in its entirety.

BACKGROUND

1. Field

The present disclosure relates to a memory device and a refresh controlling method thereof.

2. Description of the Related Art

As the size of computing devices continues to decrease and their capacities and capabilities continue to increase, the minimum device geometries used to manufacture the components continue to decrease. As the density of memory cells increases in a memory device, electric charges of memory cells in an adjacent row may be affected by a voltage distribution in a certain row. In particular, when a row is intensively accessed, data stored in memory cells of an adjacent row may be changed due to the voltage in an activated state of the corresponding row. This phenomenon is called row hammer. For row hammer defense, a function of refreshing the entire memory cells on a regular period, and a function of refreshing rows that are intensively attacked among memory cells may be applied to a memory device.

SUMMARY

The present disclosure attempts to provide a memory device and a refresh controlling method thereof capable of preventing a bit flip caused by refresh due to the access when some rows are intensively accessed.

A memory device according to an embodiment includes a memory cell array including a plurality of memory cells disposed in a plurality of rows, a register configured to store row addresses corresponding to the plurality of rows and the access count for the plurality of rows, and a refresh controller configured to determine a refresh address based on the stored row addresses and when a refresh command being received, and change a refresh period for a target row based on the refresh address being associated with a previously performed refresh for the target row and the access count for a row corresponding to the target row being reached a threshold value.

A memory device according to an embodiment includes a memory cell array including a plurality of memory cells disposed in a plurality of rows, a register counter includes a first register counter configured to store r row addresses among a plurality of row addresses corresponding to r rows among the plurality of rows and access count for the r rows, r being an integer greater than 1, and a second register counter configured to store s row addresses among the plurality of row addresses corresponding to s rows among the plurality of rows and access count for the s rows, s being an integer greater than 1, and the register counter configured to increase the access count based on an active command being received, and a refresh controller configured to determine a refresh address based on the stored row addresses, determine whether intensive access is performed on the r rows based on a refresh signal being received when the access count of the second register counter matches a predetermined value, and increase a refresh period for a target row corresponding to the refresh address based on the determination that the intensive access is performed on the r rows.

A refresh controlling method of a memory device including a plurality of memory cells disposed in a plurality of rows, the method according to an embodiment includes determining a refresh address when a refresh command is received, determining whether only one row is accessed based on the refresh address, determining whether only n (n is an integer greater than 1) or less rows are accessed based on the refresh address when it is not determined that only the one row is accessed, and changing a refresh period for a target row when it is determined that only the n or less rows are accessed.

BRIEF DESCRIPTION OF THE DRAWINGS

FIG. 1 is a schematic block diagram of a memory system according to an embodiment of the present disclosure.

FIG. 2 is a schematic block diagram of a memory device of FIG. 1 according to an embodiment.

FIG. 3 illustrates a row access table managed by a refresh control circuit according to an embodiment.

FIG. 4 illustrates a victim table managed by a refresh control circuit according to an embodiment.

DETAILED DESCRIPTION OF THE EMBODIMENTS

Figure 5:
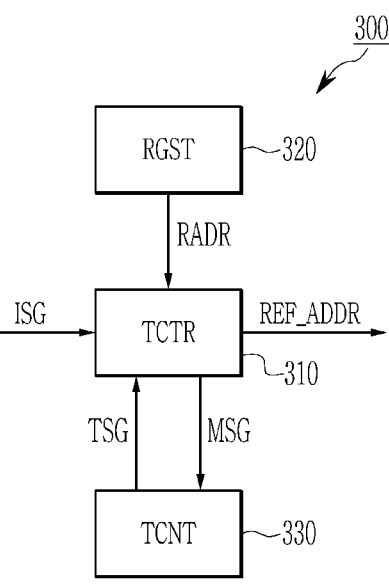
FIG. 5 is a block diagram of a refresh control circuit according to an embodiment.

Hereinafter, the present disclosure will be described in detail hereinafter with reference to the accompanying drawings, in which embodiments of the present disclosure are shown. As those skilled in the art would realize, the described embodiments may be modified in various different ways, all without departing from the spirit or scope of the present disclosure.

The drawings and descriptions are to be regarded as illustrative in nature and not restrictive. Like reference numerals designate like elements throughout the specification. In the flowchart described with reference to drawings in this description, the operation order may be changed, several operations may be merged, certain operations may be divided, and specific operations may not be performed.

In the description, expressions described in the singular in this specification may be interpreted as the singular or plural unless an explicit expression such as "one" or "single" is used. Although terms of "first," "second," and the like are used to explain various constituent elements, the constituent elements are not limited to such terms. These terms are only used to distinguish one constituent element from another constituent element.

Figure 1:
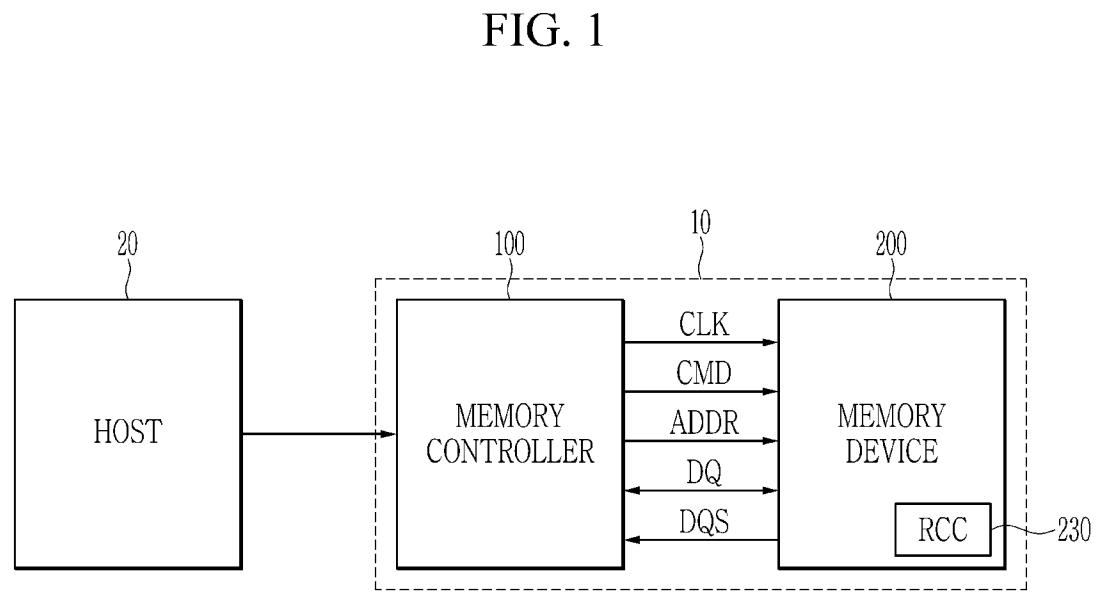

FIG. 1 is a schematic block diagram of a memory system according to an embodiment of the present disclosure.

Referring to FIG. 1, a memory system 10 may include a memory controller 100 and a memory device 200.

The memory controller 100 may control the overall operations of the memory system 10.

The memory controller 100 may write data DQ to the memory device 200 or read data DQ from the memory device 200 using a clock signal CLK, a command CMD, and an address ADDR. For example, the memory controller 100 may control the operation of the memory device 200 by providing the command CMD and the address ADDR with the memory device 200 in synchronization with the clock signal CLK. The memory device 200 may transmit the data DQ and a data strobe signal DQS to the memory controller 100. For example, the memory controller 100 and the memory device 200 may be connected using an individual pin and an individual transmission line to exchange the clock signal CLK, the command CMD, the address ADDR, the data DQ, or the data strobe signal DQS.

The memory controller 100 may control the memory device 200 in response to a command from a host 20. For example, the memory controller 100 may transmit the command CMD to the memory device 200 based on a refresh-related command periodically received from the host 20. The host 20 may communicate with the memory controller 100 using an interface protocol, such as compute express link CXL, peripheral component interconnect express PCIe, advanced technology attachment ATA, serial ATA SATA, parallel ATA PATA, or serial attached SCSI SAS. Further, interface protocols between the host 20 and the memory controller 100 are not limited to the above examples, and may be implemented as any of other interface protocols, such as universal serial bus USB, multi-media card MMC, enhanced small disk interface ESDI, or integrated drive electronics IDE.

The memory device 200 may be a dynamic random access memory (DRAM), such as a double data rate synchronous DRAM (DDR SDRAM), a low power double data rate SDRAM (LPDDR SDRAM), a graphics double data rate SDRAM (GDDR SDRAM), rambus DRAM (RDRAM), and the like.

The memory device 200 may include a refresh control circuit RCC 230 for performing refresh by recharging data in memory cells. The refresh control circuit 230 may perform refresh based on the command CMD of the memory controller 100. For example, the refresh control circuit 230 may perform normal refresh, target row refresh (TRR), self-refresh, and the like. Here, the normal refresh may mean a refresh operation by the memory device 200 for retention of data stored in memory cells of the memory device 200, the target row refresh may mean a refresh operation performed by the memory device 200 on a row adjacent to a row where intensive access occurs, and the self-refresh may mean a refresh operation performed by the memory device 200 while changing an address on its own. The normal refresh may be performed in response to an outer refresh command or refresh address. According to an embodiment, the memory controller 100 may determine the refresh type, or the refresh control circuit 230 of the memory device 200 may determine the refresh type.

The refresh control circuit 230 may control a refresh period for the target row. The refresh period for the target row may be referred to as a target row refresh period TRR PERIOD. That is, the refresh control circuit 230 may control the frequency of performing target row refresh. For example, the refresh control circuit 230 may skip the target row refresh of a specific row. The refresh control circuit 230 may skip the target row refresh, remain in an idle state, or perform the normal refresh. In another embodiment, the refresh control circuit 230 may change the ratio of the target row refresh and other refreshes (e.g., normal refreshes). For example, the refresh control circuit 230 may perform two normal refreshes and one target row refresh TRR based on three refresh commands before the target row refresh period TRR PERIOD is changed, and the refresh control circuit 230 may perform only three normal refreshes based on the three refresh commands after the target row refresh period TRR PERIOD is changed. Accordingly, the memory device 200 may reduce power consumption and improve reliability by preventing unnecessary target row refresh and promoting efficient refresh.

In an embodiment, the refresh control circuit 230 may change the period (or frequency) of the target row refresh period when continuous accesses are performed to one row. Hereinafter, the content of changing the period may be understood or replaced with the content of changing the frequency. The refresh control circuit 230 may determine if only one row is being accessed intensively. For example, when continuous access is performed to a first row, the refresh control circuit 230 may perform target row refresh on second rows adjacent to the first row. After the refresh control circuit 230 performs the target row refresh on the second rows, the first row may continue to be accessed. The refresh control circuit 230 may determine whether the first row is continuously accessed based on an internal signal ISG or a row address ROW_ADDR. For example, the refresh control circuit 230 may determine that the first row is continuously accessed when the first row is continuously accessed a predetermined number of times or when the first row is accessed a predetermined number or more during a predetermined period of times. When the first row is continuously accessed, the refresh control circuit 230 may determine whether to perform target row refresh on the second rows based on the number of target row refreshes of the second rows. For example, the refresh control circuit 230 may change the target row refresh period when the number of target row refreshes of the second rows is greater than or equal to a reference value.

In an embodiment, the refresh control circuit 230 may change the target row refresh period when continuous accesses are performed to rows equal to or less than a reference number. The refresh control circuit 230 may determine if only a few rows are being intensively accessed. For example, the refresh control circuit 230 may store and manage n (n is an integer greater than 1) row addresses for target row refresh. The refresh control circuit 230 may store a row access table managing frequently accessed rows. In an embodiment, the reference number may be n/2, but the embodiment is not necessarily limited thereto, and may be implemented using various numbers, such as n/3 and n/4, and the like. When continuous access is performed to n/2 or less third rows, the refresh control circuit 230 may perform target row refresh on fourth rows adjacent to the third rows. After the refresh control circuit 230 performs a target row refresh on the fourth rows, the third rows may continue to be accessed. The refresh control circuit 230 may determine whether to perform target row refresh on the fourth rows based on the number of target row refreshes of the fourth rows. For example, the refresh control circuit 230 may change the target row refresh period when the number of target row refreshes of the fourth rows is equal to or greater than the reference value.

FIG. 2 is a schematic block diagram of the memory device of FIG. 1 according to an embodiment, FIG. 3 illustrates a row access table managed by a refresh control circuit according to an embodiment, and FIG. 4 illustrates a victim table managed by a refresh control circuit according to an embodiment.

Referring to FIG. 2, the memory device 200 may include a control logic 210, an address register 220, a refresh control circuit 230, and a bank control logic 240, a plurality of row decoders 250, a plurality of column decoders 260, an input/output gating circuit 270, a data input/output buffer 280, a plurality of memory cell arrays 290, and a plurality of sense amplifiers 295.

The control logic 210 may control the operation of the memory device 200. For example, the control logic 210 may generate the internal signal ISG based on the command CMD so that the memory device 200 performs a write operation, an erase operation, a read operation, a refresh operation, and the like.

The control logic 210 may include a command decoder 215. The command decoder 215 may decode the command CMD received from the memory controller 100 and generate the internal signal ISG so that the memory device 200 operates according to the command CMD. The command CMD may include a write enable signal WEB, a row address strobe signal RASB, a column address strobe signal CASB, a chip selection signal CSB, a clock enable signal CKE, and the like. The internal signal ISG may include an active signal (or an active command), a precharge signal (or a precharge command), a refresh signal (or a refresh command), a write signal (or a write command), an erase signal (or an erase command), a read signal (or a read command), and the like. The refresh signal may include a normal refresh signal, a target row refresh signal, and the like. According to an embodiment, the command decoder 215 may generate the internal signal ISG based on the command CMD and address information received from the address register 220. FIG. 2 illustrates that the control logic 210 outputs the internal signal ISG to the refresh control circuit 230, but is not necessarily limited thereto, and the control logic 210 may also output the internal signal ISG to other components of the memory device 200. For example, the control logic 210 may provide the internal signal ISG to the plurality of row decoders 250, and the plurality of row decoders 250 may operate based on the internal signal ISG.

The address register 220 may receive the address ADDR from the memory controller 100. The address ADDR may include a bank address BANK_ADDR, a row address ROW_ADDR, and a column address COL_ADDR. The address register 220 may provide the row address ROW_ADDR to the refresh control circuit 230 and the row decoder 250, provide the bank address BANK_ADDR to the refresh control circuit 230 and the bank control logic 240, and provide the column address COL_ADDR to the plurality of column decoders 260.

In FIG. 2, the control logic 210 and the address register 220 are shown as separate constituent elements, but are not necessarily limited thereto, and the control logic 210 and the address register 220 may be implemented as one indivisible constituent circuit.

Referring to FIG. 3 together, the refresh control circuit 230 may store and manage frequently accessed rows in the memory cell array 290 in a row access table 1000. The refresh control circuit 230 may manage access count of rows (i.e., the number of row accesses) based on the active signal. The refresh control circuit 230 may include a counter that counts the access count of rows. For example, the refresh control circuit 230 may store the access count for each row in the row access table 1000. The refresh control circuit 230 may manage the row access table 1000 for each bank. The refresh control circuit 230 may generate the row access table 1000 based on at least one of the bank address BANK_ADDR and the row address ROW_ADDR.

The memory controller 100 randomly accesses the address of the memory device 200 according to a command from the host 20, and may sometimes intensively access a specific address. When a specific row is intensively accessed, data stored in memory cells of an adjacent row of the specific row may be changed due to voltage in an activated state of the specific row.

The row access table 1000 may include a row having the greatest access counts, and the access count of the corresponding row. The row access table 1000 may manage rows in descending order of access counts.

The row access table 1000 manages frequently accessed rows in a first memory cell array 290_1, and the access count of the rows. In the first memory cell array 290_1, row 462 may have been accessed 500 times, row 3 may have been accessed 448 times, row 9 may have been accessed 411 times, row 50 may have been accessed 357 times, and row 1032 may have been accessed 271 times.

Referring to FIG. 4 together, the refresh control circuit 230 may calculate a victim point based on the access count of a row. For example, the refresh control circuit 230 may calculate a victim point based on the row access table 1000 of FIG. 3. The refresh control circuit 230 may increase a first value to a victim point of two rows directly adjacent to the accessed row (e.g., a row at position +1 and a row at position −1). For example, the victim point of a particular row may be calculated based on access count of the adjacent rows of the particular row.

According to an embodiment, the refresh control circuit 230 may increase a second value to a victim point of a row within a predetermined distance from the accessed row (e.g., rows at position −p to position +q relative to the accessed row, p and q are integers greater than 1, which may be the same or different depending on the embodiment). The second value may be less than the first value.

The refresh control circuit 230 may manage a victim table 2000 storing a victim row VROW and victim point of the victim row VROW. The victim table 2000 may be stored with a victim point of 520 for the row 461, a victim point of 503 for the row 463, a victim point of 477 for the row 4, a victim point of 449 for the row 2, and a victim point of 411 for the row 10. For example, the victim point of 520 for the row 461 may be determined based on access count 500 for the row 462 and access count 20 for the row 460.

The refresh control circuit 230 may generate a refresh address REF_ADDR based on at least one of the row access table 1000 and the victim table 2000. In an embodiment, the refresh control circuit 230 may output a row adjacent to a row having the highest access count in the row access table 1000 (e.g., row 462) as the refresh address REF_ADDR. In an embodiment, the refresh control circuit 230 may output a victim row having the highest victim point in the victim table 2000 (e.g., row 461) as the refresh address REF_ADDR. In FIGS. 3 and 4, while it is described that the refresh control circuit 230 generates the refresh address REF_ADDR based on at least one of the row access table 1000 and the victim table 2000, but the embodiment is not necessarily limited thereto, and the refresh control circuit 230 may generate the refresh address REF_ADDR using various methods utilizing the access count of the row.

The refresh control circuit 230 may change the target row refresh period. In an embodiment, the refresh control circuit 230 may change the target row refresh period when a situation in which only one row is intensively refreshed is detected. For example, the memory device 200 may perform a refresh operation using the changed refresh period during a predetermined period of times. In an embodiment, the refresh control circuit 230 may change the target row refresh period when a situation in which only a small number of rows are intensively refreshed is detected. For example, the refresh control circuit 230 may not output the refresh address REF_ADDR, or may change (increase or decrease) the period of outputting the refresh address REF_ADDR, or may output a normal refresh address instead of the target row refresh address, or may enter the idle state.

When the refresh control circuit 230 outputs the refresh address REF_ADDR to the plurality of row decoders 250, the row decoder 250 may perform refresh on the plurality of memory cell arrays 290 based on the refresh address REF_ADDR. When refreshing is performed on the plurality of memory cell arrays 290, the refresh control circuit 230 may initialize at least one of the access count and victim point. For example, the refresh control circuit 230 may initialize the access count of row 462 in the row access table 1000 or the victim point of row 461 in the victim table 2000.

The bank control logic 240 may generate a bank control signal in response to the bank address BANK_ADDR, and output the generated bank control signal to the plurality of row decoders 250 and the plurality of column decoders 260. The plurality of row decoders 250 may include first to nth row decoders 250_1 to 250_n (n is an integer greater than 1). The plurality of column decoders 260 may include first to nth column decoders 260_1 to 260_n (n is an integer greater than 1). In response to the bank control signal, a row decoder corresponding to the bank address BANK_ADDR among the first to nth row decoders 250_1 to 250_n may be activated, and the column decoder corresponding to the bank address BANK_ADDR among the first to nth column decoders 260_1 to 260_n may be activated.

The plurality of memory cell arrays 290 may include first to nth memory cell arrays 290_1 to 290_n (n is an integer greater than 1). That is, the number of memory cell arrays 290 may be equal to the number of row decoders 250 and the number of column decoders 260. For example, n may be implemented as 8, 16, 32, etc.

The first to nth row decoders 250_1 to 250_n may be connected to the first to nth memory cell arrays 290_1 to 290_n, respectively. The first to nth column decoders 260_1 to 260_n may be connected to the first to nth memory cell arrays 290_1 to 290_n, respectively. Further, the plurality of sense amplifiers 295 may include first to nth sense amplifiers 295_1 to 295_n respectively connected to the first to nth memory cell arrays 290_1 to 290_n.

First to nth row decoders 250_1 to 250_n, first to nth column decoders 260_1 to 260_n, first to nth sense amplifiers 295_1 to 295_n, and first to nth memory cell arrays 290_1 to 290_n may configure the first to nth banks, respectively. Each of the first to nth memory cell arrays 290_1 to 290_n may include a plurality of memory cells disposed in a plurality of rows and a plurality of columns. For example, the plurality of memory cells may be disposed at intersections of the plurality of rows and the plurality of columns. Each memory cell may have a DRAM cell structure. The plurality of rows to which memory cells are connected may be designated as a plurality of word lines, and the plurality of columns to which memory cells are connected may be designated as a plurality of bit lines. The plurality of memory cells may be connected to the plurality of word lines and the plurality of bit lines.

Among the first to nth row decoders 250_1 to 250_n, the row decoder activated by the bank control logic 240 may decode by selecting either the row address ROW_ADDR output from the address register 220, or the refresh address REF_ADDR output from the refresh control circuit 230. Each of the first to nth row decoders 250_1 to 250_n may include a multiplexer MUX for selecting one of the row address ROW_ADDR and the refresh address REF_ADDR. An activated row decoder may activate the row corresponding to the decoded address. For example, an activated row decoder may apply a row driving voltage (or word line driving voltage) to a row corresponding to a decoded address.

The plurality of column decoders 260 may activate the sense amplifiers 295 through the input/output gating circuit 270. For example, among the first to nth column decoders 260_1 to 260_n, the column decoder activated by the bank control logic 240 may activate the sense amplifier corresponding to the bank address BANK_ADDR and the column address COL_ADDR among the first to nth sense amplifiers 295_1 to 295_n through the input/output gating circuit 270. The plurality of column decoders 260 may include a column address latch that temporarily stores the column address COL_ADDR.

The input/output gating circuit 270 may include a circuit for gating input/output data, an input data mask logic, a read data latch for storing data output from the memory cell array 290, and a write driver for writing data into the memory cell array 290.

Data DQ read from one of the first to nth memory cell arrays 290_1 to 290_n may be detected by a sense amplifier corresponding to the memory cell array, and stored in a read data latch. The data DQ stored in the read data latch may be provided to the memory controller 100 through the data input/output buffer 280. In addition, data DQ to be written in one of the first to nth memory cell arrays 290_1 to 290_n may be provided to the data input/output buffer 280 from the memory controller 100. The data DQ provided to the data input/output buffer 280 may be written into one memory cell array through write drivers.

FIG. 5 is a block diagram of a refresh control circuit according to an embodiment.

Referring to FIG. 5, a refresh control circuit 300 according to an embodiment may include a TRR controller (TCTR) 310, a register (RGST) 320, and a TRR counter (TCNT) 330. The TRR controller 310 may perform target row refresh on the memory cell array. The TRR controller 310 may output a refresh address REF_ADDR for target row refresh based on the internal signal ISG. The TRR controller 310 may receive the internal signal ISG from the control logic of the memory device. The internal signal ISG may be a refresh signal.

The TRR controller 310 may receive a row address RADR from the register 320 when the internal signal ISG is received. The row address RADR may be an address of a row related to target row refresh. For example, the row address RADR may be an address of a row that is a target of the target row refresh, or an address of a row with the highest access count. The register 320 manages the access count of rows, and may output the row address RADR to the TRR controller 310 based on the access count. For example, the register 320 may receive the internal signal ISG and transmit the row address RADR to the TRR controller 310.

As another example, the TRR controller 310 may transmit an address request signal to the register 320 when the internal signal ISG is received, and the register 320 may transmit the row address RADR to the TRR controller 310 in response to the address request signal.

The register 320 may include a row access table (1000 in FIG. 3) or a victim table (2000 in FIG. 4). For example, the register 320 may determine a row having the greatest access count based on the row access table, and output an address of an adjacent row of the determined row as the row address RADR. As another example, the register 320 may determine a victim row having the highest victim point based on the victim table, and output the address of the victim row as the row address RADR.

The TRR controller 310 may determine the refresh address REF_ADDR based on the row address RADR. The TRR controller 310 may determine whether the refresh address REF_ADDR is the same as a previously refreshed address. For example, the TRR controller 310 may store the refreshed address history. The TRR controller 310 may store the refreshed address history in the register 320, or store the refreshed address history in a separate storage space. The TRR controller 310 may output a match signal MSG to a TRR counter 330 when the refresh address REF_ADDR is the same as the previously performed refresh address. The match signal MSG may include information about the refresh address REF_ADDR. In one embodiment, the TRR controller 310 may output the match signal MSG when the refresh address REF_ADDR is the same as the preceding refresh address. For example, the match signal MSG is output when the refresh address REF_ADDR matches an address of a target row performed refresh immediately before. In an embodiment, the TRR controller 310 may output the match signal MSG when the refresh address REF_ADDR is included in the refresh history of x times (where x is an integer greater than 1) previously performed.

Depending on the embodiment, x may be determined as a different number.

The TRR counter 330 may increase a count value corresponding to the refresh address REF_ADDR when the match signal MSG is received. The TRR counter 330 may determine whether a count value corresponding to the refresh address REF_ADDR has been reached a threshold value. The TRR counter 330 may maintain the count value corresponding to the refresh address REF_ADDR when the count value corresponding to the refresh address REF_ADDR does not reach the threshold value. The TRR counter 330 may output a threshold signal TSG to the TRR counter 330 when the count value corresponding to the refresh address REF_ADDR reaches a threshold value. According to an embodiment, the TRR counter 330 may manage a plurality of count values corresponding to a plurality of refresh addresses. For example, the TRR counter 330 may store a first refresh address, a first count value corresponding to the first refresh address, a second refresh address, and a second count value corresponding to the second refresh address. The TRR counter 330 may use an identifier instead of a refresh address. When the match signal MSG includes information on the first refresh address, the TRR counter 330 may increase the first count value. The TRR counter 330 may output the threshold signal TSG when the first count value reaches the threshold value. Similarly, the same description may be applied to the case where the match signal MSG includes information on the second refresh address.

The TRR controller 310 may change the target row refresh period when the threshold signal TSG is received.

The TRR controller 310 may be in an idle state without outputting the refresh address REF_ADDR. As another example, the TRR controller 310 may output the normal refresh address without outputting the refresh address REF_ADDR. In this case, the TRR controller 310 may include a logic circuit for generating a normal refresh address, or may receive a normal refresh address from a logic circuit external to the TRR controller 310.

For example, the TRR controller 310 may remain in an idle state without outputting the refresh address REF_ADDR even though the internal signal ISG, which is a refresh signal, is received, or may output a normal refresh address.

When the TRR controller 310 transmits the match signal MSG and does not receive the threshold signal TSG, the TRR controller 310 may output the row address RADR as the refresh address REF_ADDR to the row decoder. In one embodiment, the TRR controller 310 may transmit the match signal MSG and wait for the threshold signal TSG for a certain period of time. The TRR controller 310 may output the row address RADR when the threshold signal TSG is not received for a certain period of time. In one embodiment, the TRR counter 330 may transmit a response signal to the TRR controller 310 in response to the match signal MSG. The TRR counter 330 may output a first response signal when the count value reaches the threshold value, and may output a second response signal when the count value does not reach the threshold value (i.e. when the count value is less than the threshold value). The first response signal may include the threshold signal TSG. The TRR controller 310 may output the row address RADR based on the second response signal.

As such, the refresh control circuit 300 according to an embodiment may reduce power consumption by reducing frequency of the target row refresh in a situation where one row is intensively accessed, and may also prevent the target row refresh operation from operating as self-hammering and causing a bit flip of an adjacent cell.

Although the register 320 and the TRR counter 330 are illustrated as being implemented as separate constituent circuits in FIG. 5, the embodiment is not necessarily limited thereto, and the register 320 and the TRR counter 330 may also be implemented by being disposed adjacently in one block and communicating with the TRR controller 310.

Figure 6:
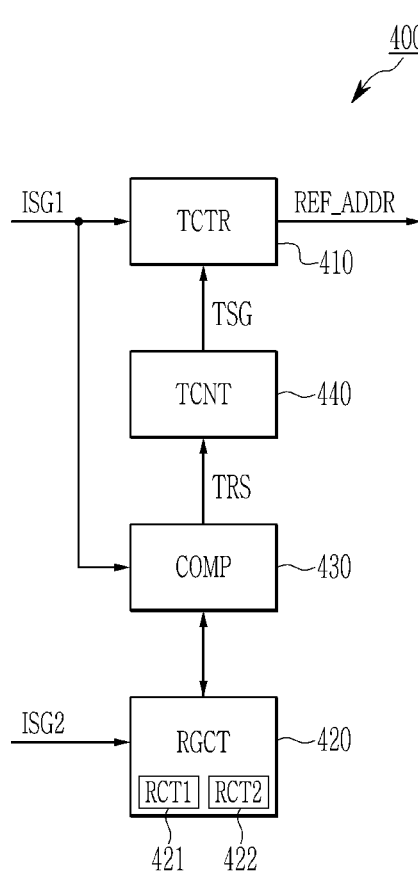
FIG. 6 is a block diagram of a refresh control circuit according to an embodiment.

FIG. 6 is a block diagram of a refresh control circuit according to an embodiment.

Referring to FIG. 6, a refresh control circuit 400 according to an embodiment may include a TRR controller (TCTR) 410, a register counter (RGCT) 420, a comparator (COMP) 430, and a TRR counter (TCNT) 440. The TRR controller 410 may perform target row refresh on the memory cell array. The TRR controller 410 may output a refresh address REF_ADDR for target row refresh based on a first internal signal ISG1. The TRR controller 410 may receive the first internal signal ISG1 from the control logic of the memory device. The first internal signal ISG1 may be a refresh signal (or a refresh command).

The TRR controller 410 may control the target row refresh period based on the threshold signal TSG when the first internal signal ISG1 is received.

The TRR controller 410 may output the refresh address REF_ADDR when the first internal signal ISG1 is received but the threshold signal TSG is not received from the TRR counter 440. For example, the TRR controller 410 may output the refresh address REF_ADDR when the threshold signal TSG is not received for a certain period of time after the first internal signal ISG1 is received. The TRR controller 410 may output the refresh address REF_ADDR based on the row address of the register counter 420. According to the embodiment, when the first internal signal ISG1 is received, the TRR controller 410 may transmit a request signal to the TRR counter 440 to determine whether the count value has been reached a threshold value. The TRR counter 440 may transmit a response signal to the TRR controller 410 in response to the request signal. The response signal may include a threshold signal TSG, or information indicating that the count value has not reached the threshold value.

The comparator 430 may be a counter comparator. The comparator 430 may check the count value of the register counter 420 when the first internal signal ISG1 is received. For example, the comparator 430 may compare the count value of the register counter 420 with a predetermined value (e.g., '0'), and output a trigger signal TRS when the values match. The register counter 420 manages the access count of rows using the row access table (1000 in FIG. 3). In this case, the count value may be the access count. According to an embodiment, the register counter 420 manages a victim point using the victim table (2000 in FIG. 4). In this case, the count value may be a victim point. The register counter 420 may include a first register counter (RCT1) 421 and a second register counter (RCT2) 422. The first register counter 421 may store r (r is an integer greater than 1) row addresses and count values for the r row addresses, and the second register counter 422 may store s (s is an integer greater than 1) row addresses and count values for the s row addresses. Depending on an embodiment, r and s may be set to the same value, or set to different values. Depending on an embodiment, the count values of the first and second register counters 421 and 422 may be the access count or victim points.

The register counter 420 may increase the count value of the row address when a second internal signal ISG2 is received.

The second internal signal ISG2 may include row address information. Depending on an embodiment, the second internal signal ISG2 may be an active signal or the refresh signal. First, the first register counter 421 stores a row address based on the second internal signal ISG2. When the first register counter 421 stores r row addresses, the second register counter 422 may store a row address based on the second internal signal ISG2. The first and second register counters 421 and 422 may store row addresses and count values in a row access table or a victim table.

The comparator 430 may check the count value of the second register counter 422 when the first internal signal ISG1 is received. In an embodiment, the comparator 430 may check a count value whenever a refresh signal is received or check a count value whenever a target row refresh signal is received among the refresh signals. The comparator 430 may output the trigger signal TRS to the TRR counter 440 when all count values of row addresses managed by the second register counter 422 are '0'. It may be understood that the count value of the second register counter 422 being '0' indicates a situation where only a few rows are accessed.

The TRR counter 440 may increase the count value when the trigger signal TRS from the comparator 430 is received. The TRR counter 440 may output the threshold signal TSG when the count value reaches the threshold value.

The TRR controller 410 may change the target row refresh period when the first internal signal ISG1 is received and the threshold signal TSG is received from the TRR counter 440. For example, the TRR controller 410 may be in an idle state without outputting the refresh address REF_ADDR. As another example, the TRR controller 410 may output a normal refresh address without outputting the refresh address REF_ADDR. In this case, the TRR controller 410 may include a logic circuit for generating a normal refresh address, or may receive a normal refresh address from a logic circuit external to the TRR controller 410. For example, the TRR controller 410 may remain in an idle state without outputting the refresh address REF_ADDR even though the first internal signal ISG1, which is a refresh signal, is received, or may output a normal refresh address.

As such, the refresh control circuit 400 according to an embodiment may reduce power consumption by reducing the target row refresh frequency in a situation where a small number of rows are intensively accessed, and may also prevent causing a bit flip of an adjacent cell due to the target row refresh operation.

Figure 7:
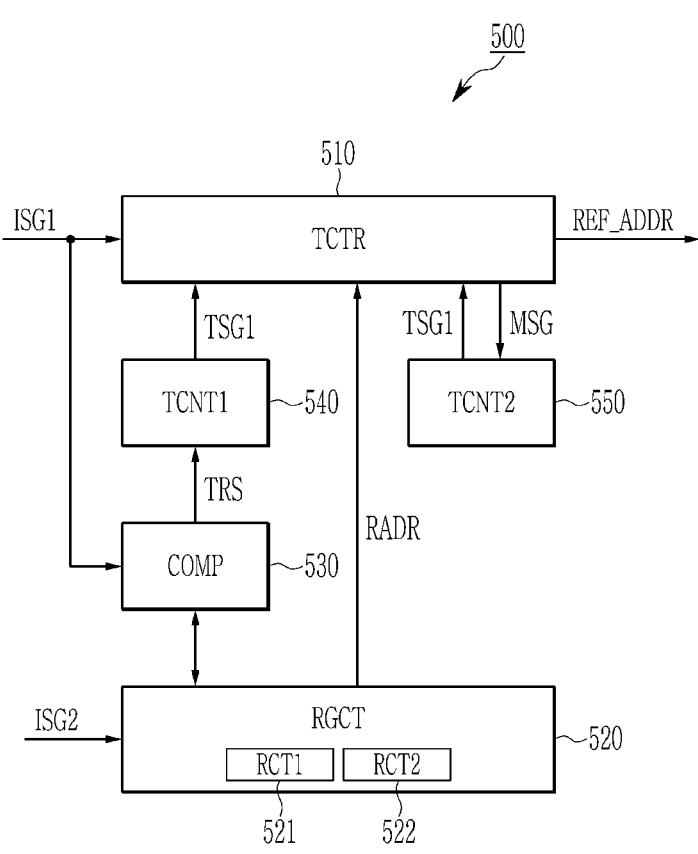
FIG. 7 is a block diagram of a refresh control circuit according to an embodiment.

FIG. 7 is a block diagram of a refresh control circuit according to an embodiment.

Referring to FIG. 7, a refresh control circuit 500 according to an embodiment may include a TRR controller (TCTR) 510, a register counter (RGCT) 520, a comparator (COMP) 530, a first TRR counter (TCNT1) 540, and a second TRR counter (TCNT2) 550. The TRR controller 510 may perform target row refresh on the memory cell array. The TRR controller 510 may output a refresh address REF_ADDR for target row refresh based on a first internal signal ISG1. The TRR controller 510 may receive the first internal signal ISG1 from the control logic of the memory device. The first internal signal ISG1 may be a refresh signal.

The TRR controller 510 may control the target row refresh period based on the threshold signals TSG1 and TSG2 when the first internal signal ISG1 is received. The TRR controller 510 may receive the threshold signal TSG1 from the first TRR counter 540, and receive the threshold signal TSG2 from the second TRR counter 550. The first TRR counter 540 may output the threshold signal TSG1 to the TRR controller 510 in a situation where a small number of rows are intensively accessed. For example, the first TRR counter 540 may output the threshold signal TSG1 to the TRR controller 510 when a first count value managed by the first TRR counter 540 reaches a first threshold value.

The second TRR counter 550 may output the threshold signal TSG2 to the TRR controller 510 in a situation where one row is intensively accessed. For example, the second TRR counter 550 may output the threshold signal TSG2 to the TRR controller 510 when the second count value managed by the second TRR counter 550 reaches the second threshold value. Depending on an embodiment, the first threshold value and the second threshold value may be the same as or different from each other.

The TRR controller 510 may change the target row refresh period when the first internal signal ISG1 is received and the threshold signals TSG1 and TSG2 are received from the first TRR counter 540. For example, the TRR controller 510 may be in an idle state without outputting the refresh address REF_ADDR. As another example, the TRR controller 510 may output a normal refresh address without outputting the refresh address REF_ADDR. In this case, the TRR controller 510 may include a logic circuit for generating a normal refresh address, or may receive a normal refresh address from logic external to the TRR controller 510. For example, the TRR controller 510 may remain in an idle state without outputting the refresh address REF_ADDR even though the first internal signal ISG1, which is a refresh signal, is received, or may output a normal refresh address.

The TRR controller 510 may output the refresh address REF_ADDR when the first internal signal ISG1 is received but the threshold signals TSG1 and TSG2 are not received.

For example, the TRR controller 510 may output the refresh address REF_ADDR when the threshold signals TSG1 and TSG2 are not received for a certain period of time after the first internal signal ISG1 is received. The TRR controller 510 may output the refresh address REF_ADDR based on the row address of the register counter 520. According to the embodiment, when the first internal signal ISG1 is received, the TRR controller 510 may transmit a request signal to the first and second TRR counters 540 and 550 to determine whether the count value has been reached a threshold value. The first and second TRR counters 540 and 550 may transmit a response signal to the TRR controller 510 in response to the request signal. Each response signal may include the threshold signals TSG1 and TSG2, or information indicating that the count value has not reached the threshold value.

The comparator 530 may check the count value of the register counter 520 when the first internal signal ISG1 is received. The register counter 520 may manage the access count of rows using a row access table. According to an embodiment, the register counter 520 may manage victim points using a victim table. The register counter 520 may include a first register counter (RCT1) 521 and a second register counter (RCT2) 522. The first register counter 521 may store r (r is an integer greater than 1) row addresses and count values, and the second register counter 522 may store s (s is an integer greater than 1) row addresses and count values. Depending on an embodiment, r and s may be set to the same value, or set to different values.

The register counter 520 may increase the count value of the row address when a second internal signal ISG2 is received. For example, the second internal signal ISG2 may be an active signal. Depending on an embodiment, the first internal signal ISG1 and the second internal signal ISG2 may be the same refresh signal. First, the first register counter 521 stores a row address based on the second internal signal ISG2, and when the first register counter 521 is full, the second register counter 522 may store a row address based on the second internal signal ISG2.

The comparator 530 may check the count value of the second register counter 522 when the first internal signal ISG1 is received. In an embodiment, the comparator 530 may check a count value whenever a refresh signal is received or check a count value whenever a target row refresh signal is received among the refresh signals. The comparator 530 may output the trigger signal TRS to the first TRR counter 540 when all count values of row addresses managed by the second register counter 522 are '0'. It may be understood that the count value of the second register counter 522 being '0' indicates a situation where only a few rows are accessed. The first TRR counter 540 may increase the first count value when the trigger signal TRS is received from the comparator 530. The first TRR counter 540 may output the threshold signal TSG1 when the first count value reaches the first threshold value.

In addition, the TRR controller 510 may receive the row address RADR from the register counter 520 when the first internal signal ISG1 is received. The row address RADR may be an address of a row related to target row refresh. For example, the row address RADR may be an address of a row that is the target of the target row refresh, or an address of a row with the highest access count. The register counter 520 manages the access count of rows, and may output the row address RADR to the TRR controller 510 based on the access count. For example, the register counter 520 may receive the second internal signal ISG2 and transmit the row address RADR to the TRR controller 510. As another example, the TRR controller 510 may transmit an address request signal to the register counter 520 when the first internal signal ISG1 is received, and the register counter 520 may transmit the row address RADR to the TRR controller 510 in response to the address request signal.

The register counter 520 may include a row access table or a victim table. For example, the register counter 520 may determine a row having the greatest access count based on the row access table, and output an address of an adjacent row of the determined row as the row address RADR. As another example, the register counter 520 may determine a victim row having the highest victim point based on the victim table, and output the address of the victim row as the row address RADR.

The TRR controller 510 may determine the refresh address REF_ADDR based on the row address RADR. The TRR controller 510 may determine whether the refresh address REF_ADDR is the same as a previously refreshed address. For example, the TRR controller 510 may store the refreshed address history. The TRR controller 510 may output the match signal MSG to the second TRR counter 550 when the refresh address REF_ADDR is the same as the previously performed refresh address. The match signal MSG may include information about the refresh address REF_ADDR. In an embodiment, the TRR controller 510 may output the match signal MSG when the refresh address REF_ADDR is the same as the preceding refresh address. In an embodiment, the TRR controller 510 may output the match signal MSG when the refresh address REF_ADDR is included in the refresh history of x times (where x is an integer greater than 1) previously performed. Depending on an embodiment, x may be determined as a different number.

The second TRR counter 550 may increase the count value for the refresh address REF_ADDR when the match signal MSG is received. The second TRR counter 550 may determine whether the second count value of the refresh address REF_ADDR has been reached a second threshold value. The second TRR counter 550 may maintain the second count value when the second count value does not reach the second threshold value. The second TRR counter 550 may output the threshold signal TSG2 to the second TRR counter 550 when the second count value reaches the second threshold value.

As such, the refresh control circuit 500 according to an embodiment may reduce power consumption by reducing the target row refresh frequency in a situation where one row or a small number of rows are intensively accessed, and may also prevent causing a bit flip of an adjacent cell due to the target row refresh operation.

Figure 8:
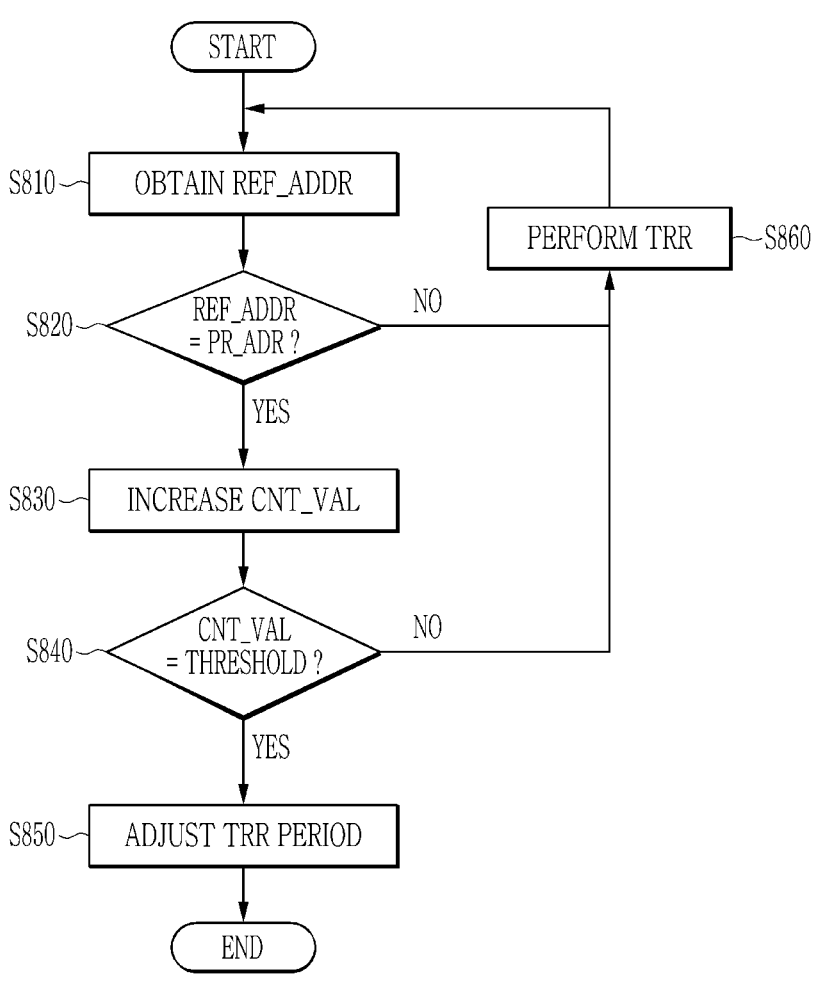
FIG. 8 is a flowchart of a refresh controlling method according to an embodiment.

FIG. 8 is a flowchart of a refresh controlling method according to an embodiment.

Referring to FIG. 8, a refresh controlling method according to an embodiment may be performed by a memory device. For example, a refresh control circuit of a memory device may perform a refresh controlling method.

The memory device may obtain the refresh address REF_ADDR (S810). For example, the memory device may obtain the refresh address REF_ADDR when a refresh command is received from a memory controller external to the memory device. The refresh address REF_ADDR may be an address of a row that is the target of the target row refresh TRR. The memory device may manage the access count of rows, and determine the refresh address REF_ADDR based on the access count.

The memory device may determine whether the refresh address REF_ADDR matches a previously refreshed address PR_ADR (S820). In one embodiment, the previous refreshed address PR_ADR may represent the preceding refresh address. In an embodiment, the previously refreshed address PR_ADR may represent an address included in a refresh history of x times (where x is an integer greater than 1) previously performed. For example, the memory device may determine whether the refresh address REF_ADDR matches the preceding refresh address or is included in the previous refresh history of x times.

The memory device may include a storage space storing and managing refresh histories.

The memory device may increase a count value CNT_VAL when the refresh address REF_ADDR matches the previously refreshed address PR_ADR (S830). The memory device includes a TRR counter, and the TRR counter may increase the count value CNT_VAL by 1 bit. If the refresh address REF_ADDR does not match the previously refreshed address PR_ADR, the memory device may perform target row refresh TRR based on the refresh address REF_ADDR (S860). The memory device may obtain a next refresh address after performing the target row refresh TRR (S810).

The memory device may determine whether the count value CNT_VAL matches a threshold value (S840). For example, the memory device may determine whether the count value CNT_VAL increased by 1 bit reaches a threshold value at step S840. For example, the threshold value may be 100, but the embodiment is not necessarily limited thereto, and the threshold value may be set differently depending on the embodiment.

If the count value CNT_VAL does not match the threshold value (i.e. if the count value CNT_VAL is less than the threshold value), the memory device may perform target row refresh TRR based on the refresh address REF_ADDR (S860), and may obtain the next refresh address (S810).

The memory device may adjust a target row refresh period TRR PERIOD when the count value CNT_VAL matches the threshold value (S850). For example, the memory device may be in an idle state, may not output the refresh address REF_ADDR, may change a ratio between normal refresh and target row refresh TRR, or may perform normal refresh. The memory device may adjust the target row refresh period TRR PERIOD and initialize the count value CNT_VAL.

As such, the refresh controlling method according to an embodiment may reduce power consumption by reducing the frequency of target row refresh (TRR) in a situation where one row is intensively accessed, and may also prevent the target row refresh (TRR) operation from operating as self-hammering and causing a bit flip of an adjacent cell.

Figure 9:
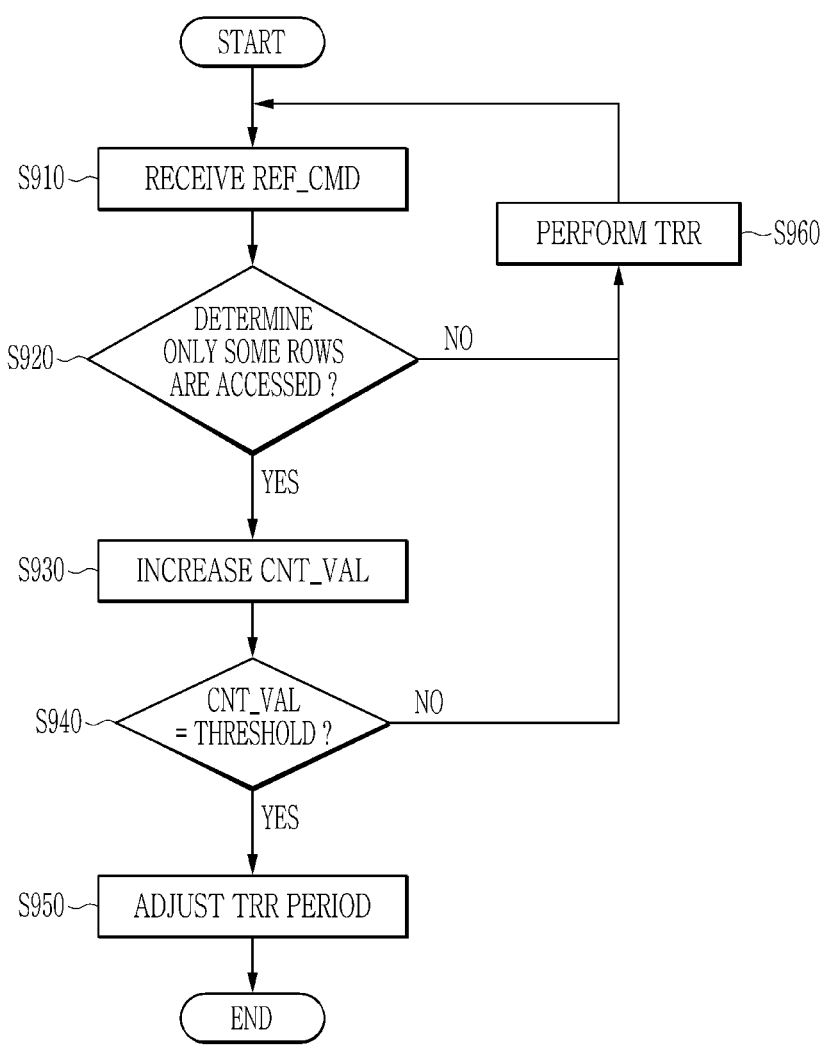
FIG. 9 is a flowchart of a refresh controlling method according to an embodiment.

FIG. 9 is a flowchart of a refresh controlling method according to an embodiment.

Referring to FIG. 9, a refresh controlling method according to an embodiment may be performed by a memory device. For example, a refresh control circuit of a memory device may perform a refresh controlling method.

The memory device may receive a refresh command REF_CMD (S910). For example, the memory device may receive the refresh command REF_CMD from a memory controller external to the memory device. The memory device may check the count value of the register when the refresh command REF_CMD is received. For example, the register may include first and second registers that store addresses and count values (e.g., access count) of rows. The first and second registers may store a plurality of row addresses and a plurality of count values corresponding to the plurality of row addresses. The first register may store a (a is an integer greater than 1) row addresses and count values, and the second register may store b (b is an integer greater than 1) row addresses and count values. Depending on an embodiment, a and b may be set to the same value or set to different values. The memory device may first store the row address and count value in the second register based on the active signal. The memory device may store the row address and count value in the second register when the first register is full.

The memory device may determine whether a situation in which only a small number of rows (e.g., Z rows (where Z is an integer greater than 1) or less) is accessed (S920). Z may be predetermined and may be less than or equal to a, which is the size of the first register. For example, the memory device may check count values of row addresses stored in the second register. When all count values of the row addresses stored in the second register are '0', the memory device may determine that only some rows are accessed. A situation in which all count values of row addresses stored in the second register are '0' may be a situation in which only the count values of the first register change and the count values of the second register do not change.

The memory device may increase the count value CNT_VAL when only some rows are accessed (S930). The memory device includes a TRR counter, and the TRR counter may increase the count value CNT_VAL by 1 bit. For example, when all count values of the row addresses stored in the second register are '0', the TRR counter may increase the count value CNT_VAL by 1 bit based on the received refresh signal (e.g., a refresh command REF_CMD). The memory device may perform target row refresh (TRR) based on the row address and count value of the register, unless only some rows are accessed (i.e. more than Z rows are accessed) (S960). The memory device may receive a next refresh command REF_CMD after performing the target row refresh (TRR) (S910).

The memory device may determine whether the count value CNT_VAL matches a threshold value (S940). For example, the memory device may determine whether the count value CNT_VAL increased by 1 bit has been reached the threshold value at step S940. For example, the threshold value may be 100, but the embodiment is not necessarily limited thereto, and the threshold value may be set differently depending on the embodiment.

If the count value CNT_VAL does not match the threshold value (i.e. if the count value CNT_VAL is less than the threshold value), the memory device may perform target row refresh TRR based on the row address of the register and the count value (S960), and may receive the next refresh command (S910).

The memory device may adjust the target row refresh period TRR PERIOD when the count value CNT_VAL matches the threshold value (S950). For example, the memory device may be in an idle state, may not output a scheduled refresh address of the target row refresh TRR, may change the ratio between normal refresh and target row refresh TRR, or may perform normal refresh. The memory device may adjust the target row refresh period TRR PERIOD and initialize the count value CNT_VAL.

As such, the refresh controlling method according to an embodiment may reduce power consumption by reducing the frequency of target row refresh TRR in a situation where a small number of rows are intensively accessed, and may also prevent causing a bit flip of an adjacent cell due to the target row refresh TRR operation.

Figure 10:
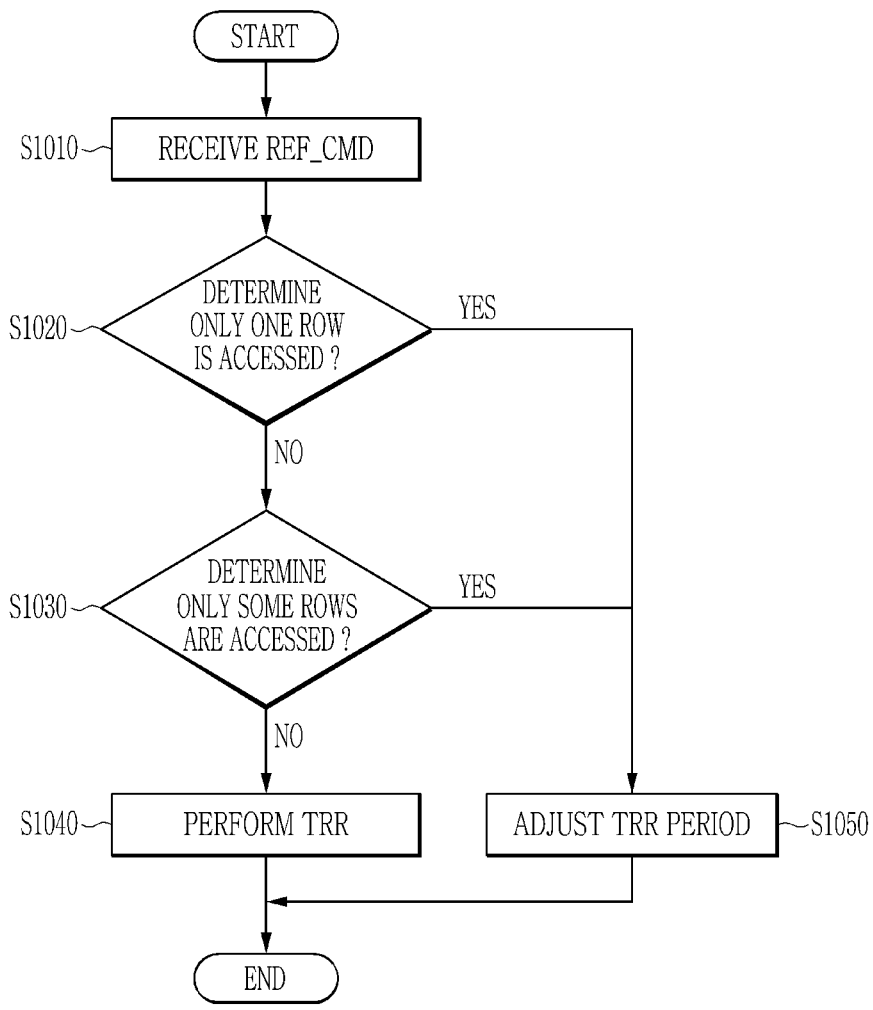
FIGS. 10 to 12 are flowcharts of a refresh controlling method according to an embodiment.
Figure 11:
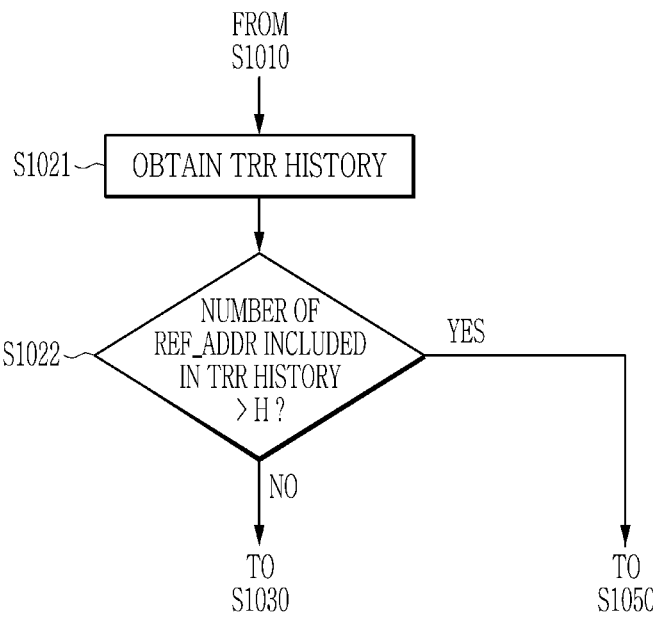
Figure 12:
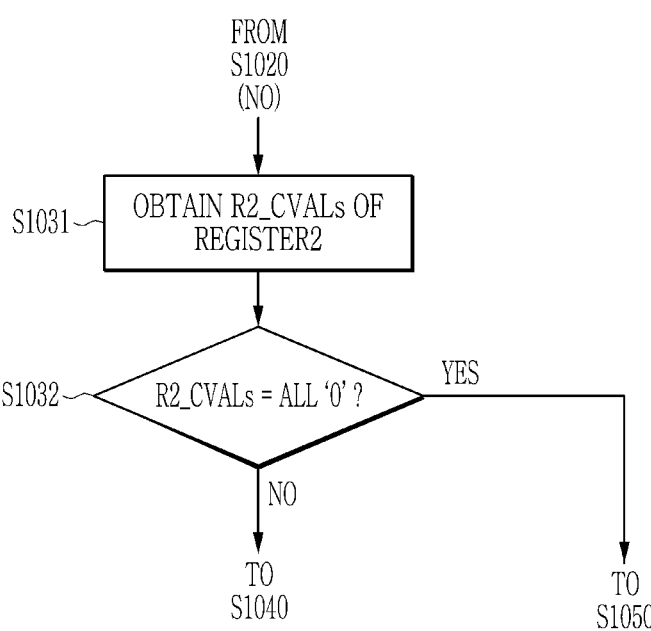

FIGS. 10 to 12 are flowcharts of a refresh controlling method according to an embodiment.

Referring to FIG. 10, a refresh controlling method according to an embodiment may be performed by a memory device. For example, a refresh control circuit of a memory device may perform a refresh controlling method.

The memory device may receive the refresh command REF_CMD (S1010). For example, the memory device may receive the refresh command REF_CMD from a memory controller external to the memory device. The memory device may check the count value of the register when the refresh command REF_CMD is received. For example, the register may include first and second registers that store addresses and count values (e.g., access count) of rows. The first and second registers may store a plurality of row addresses and a plurality of count values corresponding to the plurality of row addresses. The first register may store a (a is an integer greater than 1) row addresses and count values, and the second register may store b (b is an integer greater than 1) row addresses and count values. Depending on an embodiment, a and b may be set to the same value or set to different values. The memory device may first store the row address and count value in the second register based on the active signal. The memory device may store the row address and count value in the second register when the first register is full.

The memory device may determine whether a situation in which only one row is accessed (S1020). In one embodiment, referring to FIG. 11 together, the memory device may obtain a TRR history (S1021). The memory device may store row addresses where target row refresh TRR is performed.

When the refresh address REF_ADDR generated based on the refresh command REF_CMD is included in the TRR history more than a predetermined number (e.g., the predetermined number is H, where H is an integer greater than 1), the memory device may determine that it is a situation where only one row is accessed and proceed to step S1050.

When the number of refresh addresses REF_ADDR is less than or equal to a predetermined number in the TRR history, the memory device may determine that it is not a situation where only one row is being accessed and may proceed to step S1030.

Referring back to FIG. 10, the memory device may determine whether a situation in which only a small number of rows (e.g., less than or equal to Z rows (where Z is an integer greater than 1)) are accessed (S1030).

Z may be predetermined and may be less than or equal to a, which is the size of the first register. In one embodiment, referring to FIG. 12 together, the memory device may obtain count values R2_CVAL of the row addresses stored in the second register (S1031).

The memory device may determine whether all count values R2_CVAL of the row addresses stored in the second register are '0' (S1032). When all count values R2_CVAL of the row addresses stored in the second register are '0', the memory device may determine that only some rows are accessed and proceed to step S1050. A situation in which all of the count values R1_CVAL of the row addresses stored in the first register are '0' may be a situation in which only the count values of the first register change and the count values R2_CVAL of the second register do not change. When at least one of the count values R2_CVAL of the row addresses stored in the second register is not '0', the memory device may determine that it is not a situation where only some rows are accessed and proceed to step S1030.

Referring back to FIG. 10, the memory device may perform target row refresh TRR based on the row address and count value of the register unless only some rows are accessed (S1040). When only one row or only some rows are accessed, the memory device may adjust the target row refresh period TRR PERIOD (S1050). For example, the memory device may be in an idle state, may not output a scheduled refresh address of the target row refresh TRR, change the ratio between normal refresh and target row refresh TRR, or may perform normal refresh.

As such, the refresh controlling method according to an embodiment may reduce power consumption by reducing the frequency of target row refresh TRR in a situation where one row or a small number of rows are intensively accessed, and may prevent causing a bit flip of an adjacent cell due to the target row refresh TRR operation.

Figure 13:
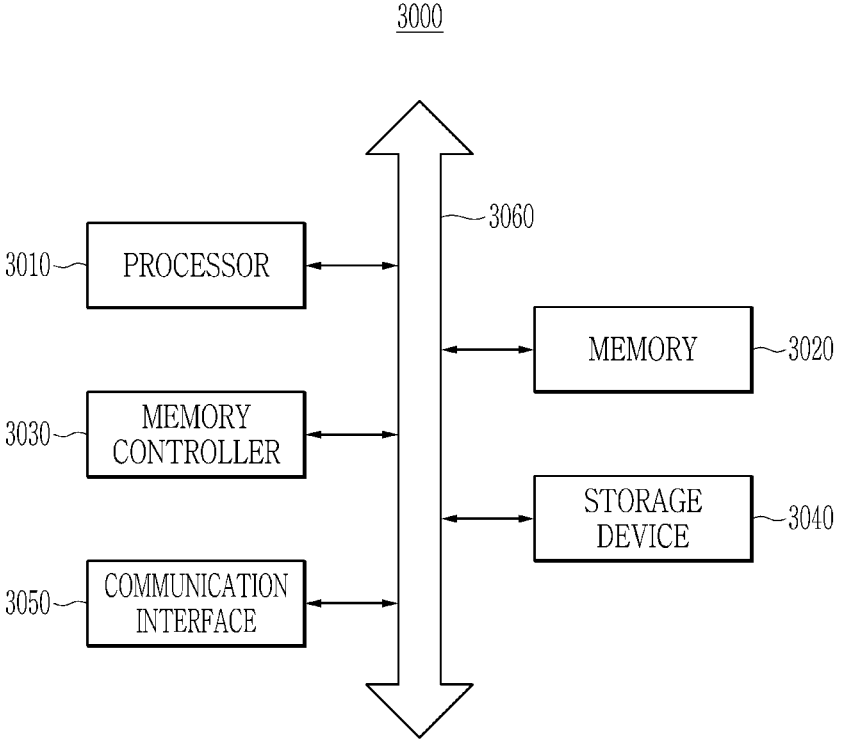
FIG. 13 is a schematic block diagram of a computer system according to an embodiment.

FIG. 13 is a schematic block diagram of a computer system according to an embodiment.

Referring to FIG. 13, a computing system 3000 may include a processor 3010, a memory 3020, a memory controller 3030, a storage device 3040, a communication interface 3050, and a bus 3060. The computing system 3000 may further include other general-purpose constituent elements.

The processor 3010 controls the overall operation of each component of the computing system 3000. The processor 3010 may be implemented as at least one of various processing units such as a central processing unit (CPU), an application processor (AP), and a graphic processing unit (GPU).

The memory 3020 stores various data and instructions. The memory 3020 may be implemented as a memory device described with reference to FIGS. 1 to 12. For example, the memory 3020 may control a target row refresh period in a situation in which only a particular one of rows are accessed or only a small number of rows are accessed. Thus, the memory 3020 may prevent bit flipping, and the computing system 3000 may reduce power consumption.

The memory controller 3030 controls the transmission of data or instruction to and from the memory 3020. The memory controller 3030 may be implemented as the memory controller described with reference to FIGS. 1 to 12. In some embodiments, the memory controller 3030 may be provided as a separate chip from the processor 3010. In some embodiments, the memory controller 3030 may be provided as an internal component of the processor 3010.

The storage device 3040 stores programs and data non-temporarily. In some embodiments, storage device 3040 may be implemented as a non-volatile memory. The communication interface 3050 supports wired and wireless internet communication of the computing system 3000. Further, the communication interface 3050 may support various communication methods other than internet communication. The bus 3060 provides a communication function between constituent elements of the computing system 3000. The bus 3060 may include at least one type of bus according to a communication protocol between constituent elements.

In some embodiments, each constituent element or combination of two or more constituent elements described with reference to FIGS. 1 to 13 may be implemented as a digital circuit, programmable or unprogrammable logic device or array, application specific integrated circuit (ASIC), and the like.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A memory device, comprising:

a memory cell array including a plurality of memory cells disposed in a plurality of rows;

a register configured to store row addresses corresponding to the plurality of rows and access count for the plurality of rows; and a refresh controller configured to:

determine a refresh address based on the stored row addresses and a refresh command being received, and change a refresh period for a target row based on the refresh address being associated with a previously performed refresh for the target row and the access count for a row corresponding to the target row being reached a threshold value, wherein the refresh controller is configured to change the refresh period for the target row by skipping output of the refresh address, by outputting a normal refresh address, or by entering an idle state of the memory device.

2. The memory device of claim 1, further comprising:

a counter configured to increase a count value when a match signal is received from the refresh controller, and output a threshold signal to the refresh controller when the count value reaches the threshold value, wherein the refresh controller is configured to output the match signal when the refresh address is associated with a previously performed refresh for the target row, and change the refresh period for the target row in response to the threshold signal being received.

3. The memory device of claim 2, wherein:

the refresh controller is configured to output information of the refresh address and the match signal to the counter, and the counter is configured to store a plurality of count values corresponding to a plurality of refresh addresses, increase a first count value corresponding to the refresh address among the plurality of count values, and output the threshold signal in response to the first count value being reached the threshold value.

4. The memory device of claim 1, wherein the memory device is configured such that when the refresh address matches an address of a target row performed refresh immediately before, the refresh controller changes the refresh period for the target row.

5. The memory device of claim 1, wherein the memory device is configured such that when the refresh address is included in addresses of a plurality of target rows performed refresh previously, the refresh controller changes the refresh period for the target row.

6. The memory device of claim 1, wherein:

the register is configured to further store victim points of the plurality of rows determined based on the access count, and the refresh controller is configured to determine the refresh address based on the victim points.

7. A memory device, comprising:

a memory cell array including a plurality of memory cells disposed in a plurality of rows;

a register counter including:

a first register counter configured to store r row addresses among a plurality of row addresses corresponding to r rows among the plurality of rows and access count for the r rows, r being an integer greater than 1, and a second register counter configured to store s row addresses among the plurality of row addresses corresponding to s rows among the plurality of rows and access count for the s rows, s being an integer greater than 1, and the register counter configured to increase the access count based on an active command being received; and a refresh controller configured to:

determine a refresh address based on the stored row addresses, determine whether intensive access is performed on the r rows based on a refresh signal being received when the access count of the second register counter matches a predetermined value, and increase a refresh period for a target row corresponding to the refresh address based on the determination that the intensive access is performed on the r rows, wherein the refresh controller is configured to increase the refresh period for the target row in response to the access count for the r rows being reached a threshold value.

8. The memory device of claim 7, further comprising:

a comparator configured to output a trigger signal based on the refresh signal when the second register counter matches the predetermined value, wherein the refresh controller is configured to increase the refresh period for the target row based on the trigger signal.

9. The memory device of claim 8, further comprising:

a TRR counter configured to increase a count value when the trigger signal is received from the comparator, and output a threshold signal to the refresh controller when the count value reaches a threshold value, wherein the refresh controller is configured to increase the refresh period for the target row when the threshold signal is received.

10. The memory device of claim 8, wherein the comparator is configured to output the trigger signal when the access count for the s rows corresponding to the second register counter matches the predetermined value.

11. The memory device of claim 10, wherein the second register counter is configured to store the s row addresses and the access count for the s rows when the first register counter is full.

12. The memory device of claim 8, wherein:

the refresh controller is configured to perform refresh based on the refresh address when the refresh signal is received, and the comparator is configured to determine whether a value of the second register counter matches the predetermined value when the refresh signal is received.

13. The memory device of claim 12, wherein the comparator is configured to determine whether the value of the second register counter matches a predetermined value when the refresh signal is a target row refresh signal.

14. The memory device of claim 7, wherein the refresh controller is configured to increase the refresh period for the target row by skipping output of the refresh address, by outputting a normal refresh address, or by entering an idle state of the memory device.

15. The memory device of claim 7, wherein:

the register counter is configured to further store victim points of the rows determined based on the access count for the rows, and the refresh controller is configured to determine the refresh address for the target row based on the access count for the rows or the victim points of the rows, and perform refresh based on the refresh address for the target row.

16. A refresh controlling method of a memory device including a plurality of memory cells disposed in a plurality of rows, the method comprising:

determining a refresh address when a refresh command is received;

determining whether only one row is accessed based on the refresh address;

determining whether only n, n being an integer greater than 1 or less rows are accessed based on the refresh address when it is not determined that only the one row is accessed; and increasing a refresh period for a target row when it is determined that only the n or less rows are accessed.

17. The method of claim 16, wherein the determining of whether only the one row is accessed includes:

determining that only the one row is accessed when the refresh address is included m times (m is an integer greater than 1) or more in a target row refresh history.

18. The method of claim 16, further comprising:

storing r row addresses corresponding to r rows and access count for the r rows among the plurality of rows in a first register counter;

storing s row addresses corresponding to s rows and access count for the s rows among the plurality of rows in a second register counter, wherein the determining of whether only n or less rows are accessed includes:

determining that only n or less rows are accessed when all values of the second register counter are '0'.

19. The method of claim 16, further comprising:

performing a refresh for the target row based on the refresh address when it is determined that more than n rows are accessed.

\*    \*    \*    \*    \*